United States Patent
Macken et al.

(10) Patent No.: US 7,130,165 B2
(45) Date of Patent: Oct. 31, 2006

(54) SIDE SHIELDED CURRENT IN PLANE SPIN-VALVE

(75) Inventors: Declan Macken, Prior Lake, MN (US); Michael K. Minor, Gibsonia, PA (US); Steven B. Slade, Fort Collins, CO (US); David J. Larson, Northfield, MN (US); Daniel J. Dummer, St. Anthony, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 255 days.

(21) Appl. No.: 10/378,451

(22) Filed: Mar. 3, 2003

(65) Prior Publication Data

US 2003/0227725 A1 Dec. 11, 2003

Related U.S. Application Data

(60) Provisional application No. 60/386,635, filed on Jun. 5, 2002.

(51) Int. Cl.
G11B 5/39 (2006.01)
(52) U.S. Cl. .................................. 360/324.12
(58) Field of Classification Search ................ 360/319, 360/322, 324.1, 324.11, 324.12; 428/692
See application file for complete search history.

(56) References Cited

U.S. PATENT DOCUMENTS

| | | | |
|---|---|---|---|
| 5,668,686 A * | 9/1997 | Shouji et al. ................ 360/319 |
| 5,739,987 A | 4/1998 | Yuan et al. |
| 5,742,459 A | 4/1998 | Shen et al. |
| 6,139,908 A | 10/2000 | Ikarashi et al. ............. 427/128 |
| 6,210,810 B1 | 4/2001 | Ikarashi et al. ............. 428/611 |
| 6,295,186 B1 | 9/2001 | Hasegawa et al. ..... 360/324.11 |
| 6,326,092 B1 | 12/2001 | Ikarashi et al. ............. 428/692 |
| 6,483,674 B1 * | 11/2002 | Kanai et al. ........... 360/324.12 |
| 6,704,175 B1 * | 3/2004 | Li et al. ................. 360/324.11 |
| 6,765,767 B1 * | 7/2004 | Trindade et al. ............ 360/319 |
| 2002/0030947 A1 | 3/2002 | Chen et al. ................. 360/319 |
| 2003/0076635 A1 * | 4/2003 | Morinaga et al. ...... 360/324.12 |
| 2003/0193761 A1 * | 10/2003 | Cornwell et al. ...... 360/324.12 |
| 2003/0202295 A1 * | 10/2003 | Wang et al. ........... 360/324.12 |

* cited by examiner

*Primary Examiner*—Angel Castro
(74) *Attorney, Agent, or Firm*—Kinney & Lange, P.A.

(57) ABSTRACT

The magnetoresistive sensor has an MR stack and side shields formed by contacts and/or pedestals on either side of the MR stack. The materials for the contacts and pedestals are selected to be magnetically soft, electrically conductive and have a low AMR signal. The contacts and pedestals are magnetically decoupled from the hard bias materials by placement of spacers.

18 Claims, 1 Drawing Sheet

SIDE SHIELDED CURRENT IN PLANE SPIN-VALVE

CROSS-REFERENCE TO RELATED APPLICATION

This application claims priority from Provisional Application No. 60/386,635 filed Jun. 5, 2002, for Side Shielded Current In Plane Spin-Valve.

BACKGROUND OF THE INVENTION

The present invention relates to a magnetoresistive (MR) sensor. More specifically, the present invention relates to an MR sensor utilizing side shields to reduce side reading from adjacent tracks.

Magnetoresistive (MR) sensors utilize an MR stack to read magnetically encoded information from a magnetic medium, such as a disc, by detecting magnetic flux stored on the magnetic medium. Each disc is typically organized into a large number of tracks. Each track is divided into bit fields, which are magnetized in one direction or the other representing stored information on a disc. The storage capacity of a disc is related to the size and is areal density of the disc surface. Areal density per square inch on the disc surface is given by the product of BPI (bits per inch) and TPI (tracks per inch). The objective is to place as many tracks and bits as possible on the surface of the disc in order to maximize the total bit capacity.

When an MR sensor reads a magnetic medium, the MR sensor must be positioned close enough to the medium that magnetic fields extending from the medium will go through the MR sensor. At a particular point in time, the MR sensor is positioned to read a particular bit within a particular track. Ideally only the magnetic field from one bit at a time will be read. However, magnetic flux emanates from adjacent bits within the particular track and from bits within adjacent tracks, which the MR sensor is not intended to read at this particular point in time. As areal density increases, the distance between the adjacent tracks decreases allowing the magnetic flux to penetrate the MR sensor thereby receiving magnetic field signals (sidereading) from adjacent tracks.

The focus of the art has been to increase linear bit density, which is related to the stack height or shield-to-shield spacing of the MR sensor. Many MR sensor structures include top and bottom shields in order to isolate the bit currently being read from the adjacent bits within that track, but lack the ability to isolate the MR stack from the magnetic flux of adjacent tracks.

As areal densities increase and sensor dimensions decrease, the issue of sidereading becomes a greater limitation to track densification. High linear density (BPI) is possible because the MR stack is shielded top and bottom by magnetically permeable materials. MR sensors without shielding on the sides facing adjacent tracks causes the magnetic sensing width of the sensor to potentially become greater than two times the physical width of the MR stack. Without side shields, signals from adjacent tracks can be detected by the MR stack, which results in signal noise. To compensate for the magnetic sensing width being greater than the physical width of the MR stack, the physical width of the stack has been made narrower and consequently the sensor has incurred amplitude and process control penalties.

In order to combat the wider magnetic sensing width of the MR stack and problems of track misregistration of the reader head, guard bands or empty spaces may be provided on two sides of each reading track thereby reducing the possibility of the sensor reading information from adjacent tracks. However, the inclusion of these empty spaces reduces track density and consequently areal density of the disc. Continued increases of disc capacity require improvement in MR sensor structure, for example by eliminating the need for or by reducing the size of empty spaces between reading tracks by incorporation of effective side shielding into the reader head design.

The basic structure of an MR sensor includes a bottom shield, an MR stack, hard bias elements, contacts, an insulator layer, and a top shield. The MR stack is a stack of layers of materials formed onto a bottom shield. Variation in magnetic flux passing through an MR stack causes a detectable change in the electrical properties or signal. The configuration of the layers of an MR stack varies by type, one example being a spin valve which includes from the bottom shield, an antiferromagnetic layer, a pinned layer, a spacer layer and, at the top of the stack, a free layer. Hard bias elements are located on either side of the MR stack and define the active portion of the sensor. Hard bias elements are commonly ferromagnetic materials with high coercivity such as CoPt and CoCrPt. Hard bias elements act to stabilize the response of the sensor and set the quiescent state of the sensor. Contacts are typically formed on top of the hard bias elements. Materials commonly used in contacts are electrically conductive, non-magnetic materials including Ta, Ti/W and Au. One contact is laid on each side of the MR stack and typically contacts the edges of the top layer of MR stack in CIP (current in plane) sensors. In this manner the contacts can provide a path for electrical current to and across the MR stack. Contacts and the MR stack are typically separated from the top shield by an insulator layer.

In order to effectively constrain the sensing width of an MR sensor, shielding materials could be introduced on the sides of the sensor, for example by forming shields from a NiFe alloy or Permalloy as is used for the top and bottom shields. However, this structure does not allow for inclusion of domain control structures, which are typically located to either side of the MR stack. Examples of domain control structures include: hard bias elements or alternating layers of magnetically soft materials coupled with antiferromagnetic materials. Biasing is critical to the proper operation of the sensor. Hard bias elements prevent formation of closure domains at the ends of the MR stack, reduce Barkhausen noise and hysteresis in the magnetoresistive response of the sensor. Consequently, the displacement of domain control structures in favor of side shields is not an acceptable solution.

Additionally, Permalloy is unsuitable as a material for side shielding an MR sensor. Permalloy has an anisotropic magnetoresistive signal large enough to interfere with the magnetoresistive signal from the MR stack. Second, the placement of Permalloy, or other soft magnetic material, adjacent to a hard bias element would impair the function of the MR sensor because the Permalloy would magnetically exchange couple to the hard bias element, thereby effectively reducing the coercivity of the hard bias element. Altering the magnetic properties of the hard bias would negatively affect the ability of the hard bias to control the domain structure of the MR stack, consequently harming sensor performance. There is a continuing need in the art for an MR sensor design that incorporates side shielding without otherwise compromising the domain control structures or sensor performance.

Another example to provide some shielding for an MR sensor in the track width direction, is to replace the permanent magnet bias with alternating layers of ferromagnetic (FM) and antiferromagnetic (AFM) materials. This structure has the disadvantage of requiring a magnetic anneal to activate the AFM whereby the applied field is perpendicular to the pinning direction. In other words, the AFM layer(s) must have unidirectional anisotropy to pin the FM layer(s) in the proper orientation for successful operation of the sensor. This requirement decreases the reliability of sensors of this design while increasing the difficulty and expense of manufacturing. Therefore, there is a continuing need for the development of a MR sensor with effective side shielding that can be reliably manufactured without sacrificing overall sensitivity and response of the sensor.

SUMMARY OF THE INVENTION

The present invention presents a novel configuration for a read element of an MR sensor. The MR sensor includes an MR stack shielded from sidereading by deposition of contacts and/or pedestals formed from magnetically soft materials with near zero AMR response, while magnetically separating the hard bias elements to prevent exchange coupling.

DETAILED DESCRIPTION

Figure 1:
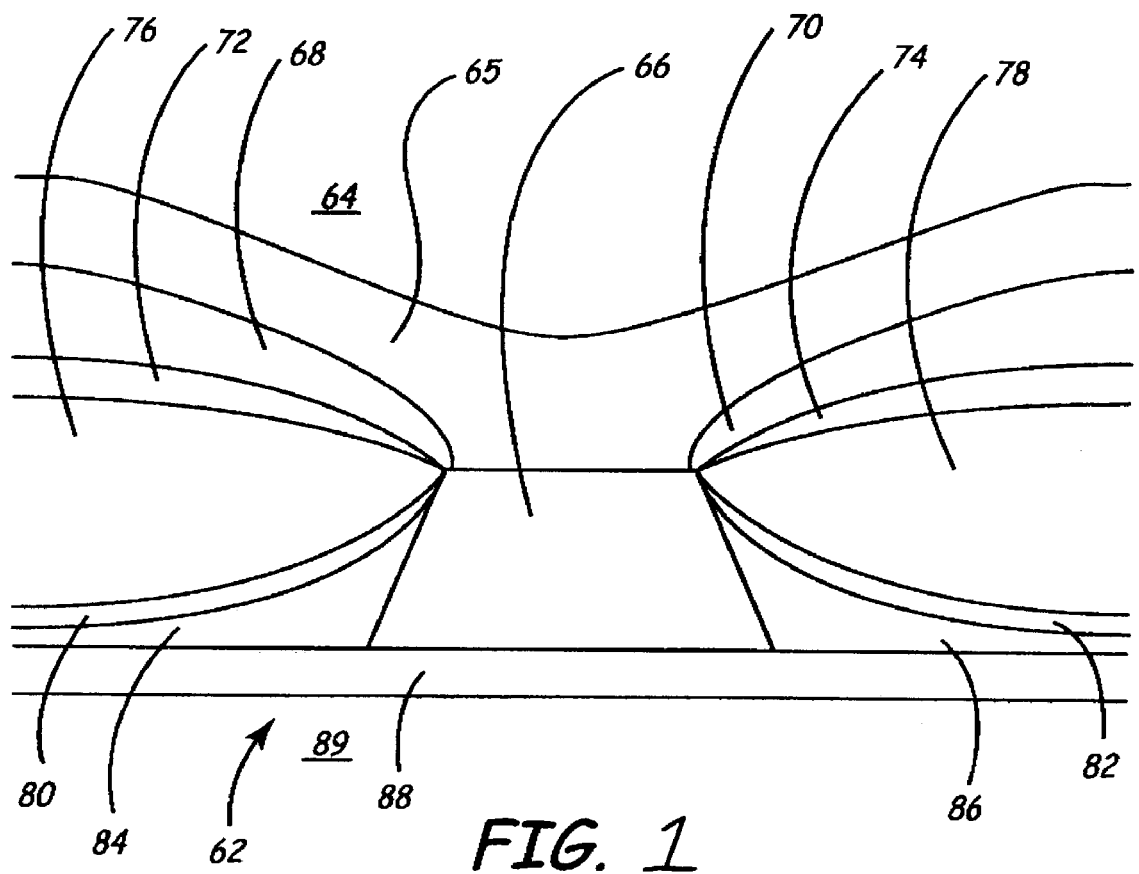
FIG. 1 shows a cross-sectional view of a MR sensor taken parallel to the air bearing surface according to the present invention.

MR sensor of the present invention incorporates side shielding by utilizing materials in the contacts and/or pedestals that provide effective side shielding. Practically, this is best achieved by depositing side shields in the same general location as the hard bias elements or contacts, which is not possible with previous MR sensor designs. The MR sensor of the present invention, as shown in FIG. 1, utilizes a novel design to incorporate materials with suitable characteristics for side shielding without compromising sensor function, including hard bias elements for domain control within the MR stack.

MR sensor 62 of the present invention incorporates materials for effective side shielding into a readily manufactured CIP design as seen in FIG. 1. MR Sensor 62 comprises top shield 64, insulator 65, MR stack 66, first contact 68, second contact 70, first upper spacer 72, second upper spacer 74, first hard bias element 76, second hard bias element 78, first lower spacer 80, second lower spacer 82, first pedestal 84, second pedestal 86, lower half gap 88 and bottom shield 89.

The manufacturing process for MR sensor 62 is described as follows: First, the layers forming MR stack 66 are deposited onto lower half gap 88 and bottom shield 89. The active region of MR stack 66 is then defined, for example by lift-off processing including deposition, exposure, and development of a resist material to form a pattern, followed by a subtractive process such as ion milling. Next, the layer forming pedestals 84 and 86 are deposited, followed by a layer forming first lower spacer 80 and second lower spacer 82. The first lower spacer 80 and second lower spacer 82 may function as seed layers for deposition of the hard bias element 76 and second hard bias element 78. Alternatively, a separate seed layer may be deposited before the hard bias elements. A layer forming first upper spacer 72 and second upper spacer 74 follows deposition of the hard bias elements. Next, material for first contact 68 and second contact 70 are deposited. The resist remaining from the lift-off processing and other materials covering the MR stack are subsequently removed. Finally, insulator 65 and top shield 64 are deposited onto exposed MR stack 66 and contacts 68 and 70.

Additional embodiments may omit first and second pedestals, 84 and 86. When the pedestals are omitted, the first and second lower spacers 80 and 82 may be retained to serve as seed layers for the hard bias elements or may optionally be omitted where a separate seed layer is used. Also, additional layers may be placed on top shield 64, for example corresponding to the writer portion of a MR sensor/writer combination head. In addition, the structures may be formed of multiple layers of materials as is known in the art.

The materials used for manufacturing MR sensors are customized for the function of each portion of the MR sensor structure. The magnetic and electrical properties of the material are important properties to consider for structures comprising, contacting or surrounding the MR stack.

Magnetic materials suitable for use as shields should be able to readily conduct magnetic flux, in other words, to conduct magnetic flux with low reluctance. For a material to conduct magnetic flux with low reluctance, it is necessary for the coercivity of the material to be low. When a material has a low coercivity, the material is described as being magnetically soft. A suitable material for use in side shields of the present invention will have coercivity approximately below 1 Oersted (Oe).

In contrast, materials used as hard bias elements, are typically permanent magnets, which have a high coercivity. The high coercivity is useful to control domain formation within the layers of the MR stack. Example materials include CoPt and CoCrPt. These materials do not readily conduct magnetic flux and therefore do not function effectively as shields. In addition, direct contact of soft magnetic materials with the hard bias elements can impair the domain control function of the hard bias elements. It is important, when placing a soft magnetic material near the hard bias elements, to insure that the soft magnetic material is not exchange coupled to the hard bias element.

Another property of magnetic material is the change in a material's dimension due to magnetization, called magnetostriction. Magnetostriction also describes the variation of a material's magnetic properties with applied stress. Magnetostriction of materials is not favorable in MR sensors due to the potential change in the magnetic properties and related sensor performance as the deposition of surrounding materials applies stress to the magnetic materials. Consequently, materials with low magnetostriction are desired for their tolerance of stress with minimal change in magnetic characteristics. Suitably low magnetostriction values for side shields of the present invention are in the range between approximately $-1\times10^{-6}$ to approximately $1\times10^6$.

The ability to readily conduct electricity is necessary for structures of an MR sensor that are part of the current path. These materials are referred to as high conductivity materials. When conductivity is high, resistivity or the resistance to flow of current is low. The conductivity of a material is typically quantified by its resistivity. For side shield structures that are part of the current path of the present invention, a resistivity approximately less than 55 $\mu\Omega$-cm is desired.

In addition to the magnetic and electrical properties described, materials used near an MR stack, but not part of the MR stack, should not produce signal in response to changes in magnetic flux. In other words, it is desirable for the MR stack to be the sole source of the signal from the MR sensor. The magnetorsistive signal or AMR relates to the noise generated within the MR sensor signal other than can be attributed to the desired MR stack response. A suitable material for use in an MR sensor should have a magnetoresistive signal ($\Delta R/R$) of less than 0.2%. More preferably, the magnetoresistive signal is near zero or zero.

The MR sensor of the present invention allows the placement of low coercivity materials suitable to operate as side shields in either the contact or pedestal regions or preferably in both areas. Suitable materials to provide side shielding that will also function as a contact and/or pedestal must have the properties of low coercivity, low magnetostriction and a low magnetoresistive signal. Additionally, relatively high electrical conductivity is required when the material will be part of the current path.

One suitable material for contacts and pedestals that provides side shielding is a NiFeCu alloy, which combines low AMR signal with high electrical conductivity, low magnetostriction and low coercivity. Cu is included to suppress the magnetoresistive signal below that of Permalloy at the expense of increasing the coercivity above that for prior art Permalloy (reducing the permeability). The composition of suitable NiFeCu alloys includes: Ni between about 45% to about 80%, Fe between about 5% to about 20% and Cu between about 10% to about 50%. An exemplary formulation is 52.6 at % Ni, 9.6 at % Fe, and 37.8 at % Cu. An alternative formulation is 71.4 at % Ni, 14.6 at % Fe, and 14.0 at % Cu, which has a lower coercivity (higher permeability) with a small increase in magnestoresistive signal over the first exemplary formulation.

Other elements such as Cr or Ti with non-magnetic characteristics may also be suitable for addition to a NiFe alloy in order to quench the magnetoresistive signal. The choice of the element needs to compromise between magnetoresistive signal quenching and maintenance of low coercivity and high conductivity. Cu is an ideal choice because of its high electrical conductivity and non-magnetic characteristics to quench the AMR signal. Also, because copper's atomic radius is similar to Ni and Fe, the addition of Cu causes minimal disruption to the crystal structure of the Ni and Fe.

Cobalt amorphous materials are also suitable for use as contacts and pedestals in side shielding configurations. Example materials, such as CoZrTa and CoZrNb have very high permeability and negligible AMR signal. However, the electrical conductivity of these materials is less favorable than the NiFeCu alloy due to the intrinsic resistivity of the amorphous materials. Therefore, these materials are suitable where electrical resistance of the sensor is not critical, or for use as pedestals when not part of the current path through the sensor.

Another suitable material is isolated ferromagnetic particles in a non-magnetic conductive matrix. Such systems offer the possibility of low coercivity combined with high electrical conductivity. The system is constructed of granular or laminated structures configured to minimize the AMR signal.

The structure of MR sensor 62 in FIG. 1 inhibits exchange coupling by including first upper spacer 72 between first contact 68 and first hard bias element 76; second upper spacer 74 between second contact 70 and second hard bias element 78; first lower spacer 80 between first pedestal 84 and first hard bias element 76; and second lower spacer 82 between second pedestal 86 and second hard bias element 78. First and second upper spacers 72 and 74 and first and second lower spacers 80 and 82 should be pinhole free, non-magnetic, electrically conductive spacers. Suitable material for the spacers includes: Au, Ta, alloys of Ti, and alloys of W.

The inventive MR sensor allows placement of magnetically soft materials in the contact and pedestal regions to shield the MR stack from side reading. A secondary benefit of incorporating magnetically soft material as side shields is a higher amplitude sensitivity of the MR sensor. The magnetic side shield material partially compensates the magnetic field from the hard bias element at the central portion of the MR sensor. The overall field from the hard bias element and side shield materials is reduced in the central region of the sensor and therefore interferes less with the signal field of interest as compared to prior art MR sensors. This aspect of the invention represents a tradeoff between amplitude gain and reduction in stability, with the key parameters being the properties of the soft magnetic materials and the separation distance from the hard bias elements.

Analysis of particular embodiments of MR sensors of the present invention provides a sensitivity profile of the sensors. The analysis includes a series of metrics, including measurement of several different parameters and comparison of those parameters. The results of the metrics performed on different sensor embodiments are shown below. Sensor A is a baseline (prior art) MR sensor provided for comparison. Sensor B utilizes the teachings of the present invention to create side shielding in the pedestal region. Sensor C utilizes the teachings of the present invention to create side shielding in the contact region. Sensors B and C are described in further detail below, including the materials and layer thickness for structures of interest.

Sensor B sensor utilizes a 50 Å Au layer to seed a NiFeCu layer (52.8 at % Ni, 7.3% Fe, 39.9% Cu) in the pedestal region. A Layer of Ta (25 Å) serves as the non-magnetic spacer separating the pedestal from the hard bias. The hard bias material is formed of a TiW (50 Å) seed layer followed by CuCrPt. The contacts are formed of alternating layers of Ta and Au.

Sensor C utilizes a layer of Ta (25 Å) followed by a layer of TiW (75 Å) as seed layers for CuCrPt hard bias material, while omitting pedestals. The contacts are separated from the hard bias material by a spacer layer of Au (50 Å). The NiFeCu material (600 Å) (52.8 at % Ni, 7.3% Fe, 39.9% Cu) is deposited on the Au spacer.

| Test | Sensor A (baseline) | | Sensor B (pedestals) | | Sensor C (contacts) | |
|---|---|---|---|---|---|---|
| | Value | Std. Dev. | Value | Std. Dev. | Value | Std. Dev. |
| LFA_AVG | 1734.93 | 536.86 | 2380.46 | 762.91 | 1966.69 | 591.03 |
| HFA_AVG | 1430.85 | 490.63 | 1936.68 | 675.23 | 1604.32 | 522.50 |
| OTC_EFL | −6.91 | 1.08 | −7.39 | 1.21 | −6.82 | 1.16 |
| PE_EFL | −7.38 | 1.15 | −7.45 | 1.18 | −7.47 | 1.22 |
| RD_WDT | 5.13 | 0.62 | 5.58 | 0.73 | 5.74 | 0.64 |
| MT_50 | 5.99 | 0.67 | 6.47 | 0.90 | 6.60 | 0.64 |
| MT_10 | 14.52 | 1.07 | 14.66 | 1.26 | 14.41 | 1.14 |
| MT10–MT50 | 8.53 | | 8.20 | | 7.81 | |
| MT10/MT50 | 2.42 | | 2.27 | | 2.18 | |
| MT10-RD_WDT | 9.39 | | 9.08 | | 8.67 | |
| MT10/RD_WDT | 2.83 | | 2.63 | | 2.51 | |

LFA_AVG Low frequency amplitude (Ave.)
HFA_AVG High frequency amplitude (Ave.)
OTC_EFL Off track error floor
PE_EFL PE error floor
RD_WDT Read width
MT_50 A reader width metric at half max signal (50%)
MT_10 A reader width metric at 10% signal
MT10/MT50 is the ratio of MT 10 to MT 50. It is a side-reading metic.

The MR Sensors incorporating the inventive structure and materials at either the contact or pedestal regions showed significant improvement in side reading over the baseline MR sensors. MT_10 and MT_50 analysis demonstrates an improvement in signal amplitude over baseline without significant degradation in stability parameters or symmetry sigma.

Although the present invention has been described with reference to preferred embodiments, workers skilled in the art will recognize that changes may be made in form and detail without departing from the spirit and scope of the invention. Particularly, the sensors built for testing are examples and are not intended to limit the scope of the invention to the particular combinations of materials and structures used.

The invention claimed is:

1. A magnetoresistive sensor having an MR stack, a first contact and a second contact, a first hard bias element and a second hard bias element and a first pedestal and a second pedestal, characterized by:
   the first contact and second contact are formed from a material with characteristics of high permeability, low coercivity, high electrical conductivity, and low magnetoresistive signal; and
   the first pedestal and the second pedestal are formed from a material with characteristics of high permeability, low coercivity and low magnetoresistive signal.

2. The magnetoresistive sensor of claim 1 wherein the magnetoresistive sensor additionally comprises:
   a first lower spacer placed between the first hard bias element and the first pedestal that magnetically decouples the first hard bias element and the first pedestal; and
   a second lower spacer placed between the second hard bias element and the second pedestal that magnetically decouples the second hard bias element and the second pedestal;
   a first upper spacer placed between the first hard bias element and the first contact that magnetically decouples the first hard bias element and the first contact; and
   a second upper spacer placed between the second hard bias element and the second contact that magnetically decouples the second hard bias element and the second contact.

3. The magnetoresistive sensor of claim 1 wherein the material is chosen from a group consisting of: NiFeCu, CoZrTa, CoZrNb, cobalt amorphous materials, and ferromagnetic particles in a conductive non-magnetic matrix.

4. The magnetoresistive sensor of claim 1 wherein the material is NiFeCu wherein Ni is between about 45% to about 80%, Fe is between about 5% to about 20% and Cu is between about 10% to about 50%.

5. The magnetoresistive sensor of claim 1 wherein the material is chosen from a group consisting of: (1)52.6 at % Ni, 9.6 at % Fe, and 37.8 at % Cu, (2)52.8 at % Ni, 7.3 at % Fe, and 39.9 at % Cu, and (3)71.4 at % Ni,14.6 at % Fe, and 14.0 at % Cu.

6. A magnetoresistive sensor having an MR stack, a first hard bias element, a second hard bias element, a first contact, a second contact, the magnetoresistive sensor characterized by:
   the first and second contacts are formed from a magnetically soft material having a magnetoresistive signal of less than about 0.2%;
   a first spacer placed between the first hard bias element and the first contact that magnetically decouples the first hard bias element and the first contact; and
   a second spacer placed between the second hard bias element and the second contact that magnetically decouples the second hard bias element and the second contact.

7. The magnetoresistive sensor of claim 6 wherein the magnetically soft material is chosen from a group consisting of: NiFeCu, CoZrTa, CoZrNb, cobalt amorphous materials, and ferromagnetic particles in a conductive non-magnetic matrix.

8. The magnetoresistive sensor of claim 6 wherein the material is NiFeCu wherein Ni is between about 45% to about 80%, Fe is between about 5% to about 20% and Cu is between about 10% to about 50%.

9. The magnetoresistive sensor of claim 6 wherein the material is chosen from a group consisting of: (1) 52.6 at % Ni, 9.6 at % Fe, and 37.8 at % Cu, (2) 52.8 at % Ni, 7.3 at % Fe, and 39.9 at % Cu, and (3) 71.4 at % Ni, 14.6 at % Fe, and 14.at % Cu.

10. A magnetoresistive sensor having an MR stack and a hard bias element formed over a pedestal, wherein the pedestal is formed from a material with characteristics of high permeability, low coercivity and a magnetoresistive signal of less than about 0.2%.

11. The magnetoresistive sensor of claim 10 wherein a spacer placed between the hard bias element and the pedestal that magnetically decouples the hard bias element and the pedestal.

12. The magnetoresistive sensor of claim 10 wherein the materials are chosen from a group consisting of: NiFeCu, CoZrTa, CoZrNb, cobalt amorphous materials, and ferromagnetic particles in a conductive non-magnetic matrix.

13. The magnetoresistive sensor of claim 10 where in the material is NiFeCu wherein Ni is between about 45% to about 80%, Fe is between about 5% to about 20% and Cu is between about 10% to about 50%.

14. The magnetoresistive sensor of claim 10 wherein the material is chosen from a group consisting of: (1) 52.6 at % Ni,9.6 at % Fe, and 37.8 at % Cu, (2) 52.8 at % Ni, 7.3 at % Fe, and 39,9 at % Cu, and (3) 71.4 at % Ni, 14.6 at % Fe, and 14.0 at % Cu.

15. A magnetoresistive sensor having an MR stack, and first and second side shields, characterized by:
   the first side shield including: a first hard bias element formed over an upper surface of a first pedestal, a first contact, a first upper spacer and a first lower spacer, wherein the first lower spacer magnetically decouples the first hard bias element and the first pedestal, and wherein the first upper spacer magnetically decouples the first hard bias element and the first contact; and
   the second side shield comprising: a second hard bias element formed over and upper surface of a second pedestal, a second contact, a second upper spacer and a second lower spacer, wherein the second lower spacer magnetically decouples the second hard bias element and the second pedestal, and wherein the second upper spacer magnetically decouples the second hard bias element and the second contact.

16. The magnetoresistive sensor of claim 15 wherein the first and second side shields are at least partially formed from a material with characteristics of high electrical conductivity, high permeability, low coercivity and low magnetoresistive signal.

17. A magnetoresistive sensor comprising:
   a plurality of generally parallel layers forming an MR stack, the MR stack having a first side, a second side, a top and a bottom;
   a first hard bias element having a top and a bottom, wherein the first hard bias element is placed adjacent to the first side of the MR stack;
   a first spacer having a top and a bottom, wherein the bottom of the first spacer is placed adjacent to the top of the first hard bias element, wherein the first spacer is formed of non-magnetic material;

a first contact placed adjacent to the top of the first spacer on either side of the MR stack and contacting the MR stack, wherein the first contact is formed of soft bias material with the properties of high electrical conductivity, high permeability, low coercivity, and a magnetoresistive signal of less than 0.2%, and wherein the first spacer magnetically decouples the first contact from the first hard bias element;

a second hard bias element having a top and a bottom, wherein the second hard bias element is placed adjacent to the second side of the MR stack;

a second spacer having a top and a bottom, wherein the bottom of the second spacer is placed adjacent to the top of the second hard bias element, wherein the second spacer is formed of non-magnetic material; and a second contact placed adjacent to the top of the second spacer and contacting the MR stack, wherein the second contact is formed of soft bias material with the properties of high electrical conductivity, high permeability, low coercivity, and a magnetoresistive signal of less than 0.2%, and wherein the second spacer magnetically decouples the second contact from the second hard bias element.

18. The magnetoresistive sensor of claim 17, and further comprising:

a first lower spacer of non-magnetic material, wherein the first lower spacer has a top and a bottom, and the top of the first lower spacer is placed adjacent to the bottom of the first hard bias element;

a first pedestal placed adjacent to the bottom of the first lower spacer, wherein the pedestal is formed of soft bias material of high permeability and low coercivity, and wherein the first pedestal is magnetically decoupled from the first hard bias element;

a second lower spacer of non-magnetic material, wherein the second lower spacer has a top and a bottom, and the top of the second lower spacer is placed adjacent to the bottom of the second hard bias element; and a second pedestal placed adjacent to the bottom of the second lower spacer, wherein the pedestal is formed of soft bias material of high permeability and low coercivity, and wherein the second pedestal is magnetically decoupled from the second hard bias element.

* * * * *